(12) United States Patent
Guha et al.

(10) Patent No.: US 10,242,883 B2
(45) Date of Patent: Mar. 26, 2019

(54) HIGH ASPECT RATIO ETCH OF OXIDE METAL OXIDE METAL STACK

(71) Applicant: Lam Research Corporation, Fremont, CA (US)

(72) Inventors: Joydeep Guha, Fremont, CA (US); Sirish K. Reddy, Hillsboro, OR (US); Kaushik Chattopadhyay, San Jose, CA (US); Thomas W. Mountsier, San Jose, CA (US); Aaron Eppler, Fremont, CA (US); Thorsten Lill, Santa Clara, CA (US); Vahid Vahedi, Oakland, CA (US); Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/632,163

(22) Filed: Jun. 23, 2017

(65) Prior Publication Data
US 2018/0374712 A1   Dec. 27, 2018

(51) Int. Cl.
| | |
|---|---|
| *H01L 21/311* | (2006.01) |
| *H01L 21/306* | (2006.01) |
| *H01L 21/308* | (2006.01) |
| *H01L 21/3213* | (2006.01) |
| *H01L 21/3065* | (2006.01) |
| *H01L 21/768* | (2006.01) |

(52) U.S. Cl.
CPC .... *H01L 21/31144* (2013.01); *H01L 21/3065* (2013.01); *H01L 21/3081* (2013.01); *H01L 21/3086* (2013.01); *H01L 21/30604* (2013.01); *H01L 21/32139* (2013.01); *H01L 21/76802* (2013.01)

(58) Field of Classification Search
CPC ......... H01L 21/31144; H01L 21/76802; H01L 21/3065; H01L 21/32139; H01L 21/3086; H01L 21/30604; H01L 21/3081
See application file for complete search history.

(56) References Cited

U.S. PATENT DOCUMENTS

| | | | |
|---|---|---|---|
| 6,187,688 | B1 | 2/2001 | Ohkuni et al. |
| 6,319,822 | B1 | 11/2001 | Chen et al. |
| 7,094,688 | B2 | 8/2006 | Oryoji |
| 7,432,194 | B2 | 10/2008 | Chou et al. |
| 2002/0173163 | A1 | 11/2002 | Gutsche |
| 2003/0129840 | A1 | 7/2003 | Kumar et al. |
| 2007/0148966 | A1 | 6/2007 | Baks et al. |

(Continued)

OTHER PUBLICATIONS

"The Properties and Uses of Silicon Metal" by https://www.thebalance.com/metal-profile-silicon-4019412 (Year: 2018).*

(Continued)

*Primary Examiner* — Nadine G Norton
*Assistant Examiner* — Mahmoud Dahimene
(74) *Attorney, Agent, or Firm* — Beyer Law Group LLP

(57) ABSTRACT

A method for etching features in an OMOM stack with first layer of silicon oxide, a second layer of a metal containing material over the first layer, a third layer of silicon oxide over the second layer, and a fourth layer of a metal containing material over the third layer is provided. A hardmask is formed over the stack. The hardmask is patterned. The OMOM stack is etched through the hardmask.

18 Claims, 13 Drawing Sheets

(56) References Cited

U.S. PATENT DOCUMENTS

| | | |
|---|---|---|
| 2008/0102619 A1 | 5/2008 | Lee |
| 2009/0090958 A1 | 4/2009 | Keller et al. |
| 2010/0167021 A1* | 7/2010 | Lee .................. H01L 21/0332 |
| | | 428/195.1 |
| 2010/0203733 A1 | 8/2010 | Kanegae et al. |
| 2010/0213446 A1 | 8/2010 | Zhang et al. |
| 2011/0237083 A1 | 9/2011 | Nakagawa et al. |
| 2013/0009122 A1* | 1/2013 | Park .................. H01L 27/2409 |
| | | 257/2 |
| 2013/0344699 A1 | 12/2013 | Chiba |
| 2014/0363963 A1* | 12/2014 | Kiyotoshi ......... H01L 21/28273 |
| | | 438/593 |
| 2015/0087154 A1 | 3/2015 | Guha et al. |
| 2016/0181259 A1 | 6/2016 | Van Houdt et al. |
| 2018/0211703 A1* | 7/2018 | Choi .................. G11C 13/0038 |

OTHER PUBLICATIONS

Office Action dated Sep. 24, 2014 from U.S. Appl. No. 14/038,388.
Notice of Allowance dated Jan. 14, 2015 from U.S. Appl. No. 14/038,388.
Office Action dated Nov. 17, 2015 from U.S. Appl. No. 14/671,601.
Final Office Action dated Jun. 2, 2016 from U.S. Appl. No. 14/671,601.
Notice of Allowance dated Jan. 11, 2017 from U.S. Appl. No. 14/671,601.
International Search Report from International Application No. PCT/US2018/036934 dated Oct. 2, 2018.
Written Opinion from International Application No. PCT/US2018/036934 dated Oct. 2, 2018.

\* cited by examiner

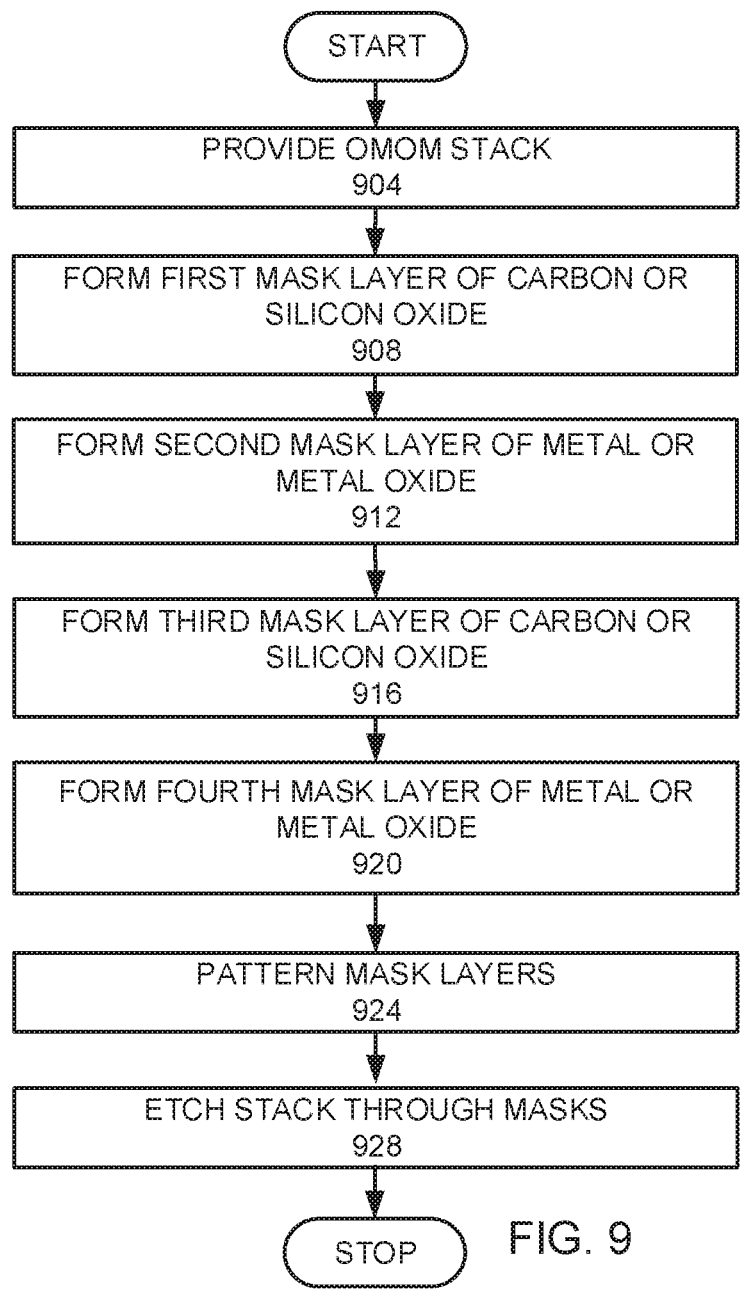

HIGH ASPECT RATIO ETCH OF OXIDE METAL OXIDE METAL STACK

BACKGROUND

The present invention relates to the formation of semiconductor devices. More specifically, the invention relates to the etching of high aspect ratio features for semiconductor devices.

During semiconductor wafer processing, in 3D flash memory devices, multiple cells are stacked up together in chain format to save space and increase packing density.

This application is related to U.S. Pat. No. 9,018,103, entitled "HIGH ASPECT RATIO ETCH WITH COMBINATION MASK" issued on Apr. 28, 2015 and U.S. Pat. No. 9,659,783, entitled "HIGH ASPECT RATIO ETCH WITH COMBINATION MASK" issued on May 23, 2017, which are both incorporated by reference for all purposes, describe processes for etching high aspect ratio features in stacks.

SUMMARY

To achieve the foregoing and in accordance with the purpose of the present disclosure, a method for etching features in an OMOM stack with first layer of silicon oxide, a second layer of a metal containing material over the first layer, a third layer of silicon oxide over the second layer, and a fourth layer of a metal containing material over the third layer is provided. A hardmask is formed over the stack. The hardmask is patterned. The OMOM stack is etched through the hardmask.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which:

FIG. 9 is a high level flow chart of a process that may be used in another embodiment.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
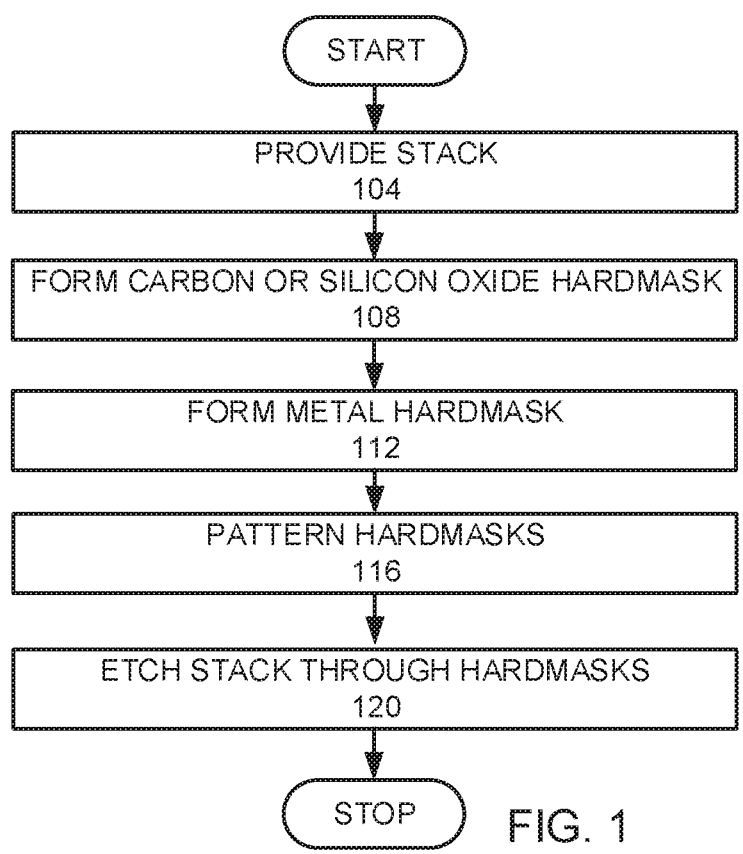
FIG. 1 is a high level flow chart of a process that may be used in an embodiment.

To facilitate understanding, FIG. 1 is a high level flow chart of a process that may be used in an embodiment. A stack is provided (step 104). A carbon or silicon oxide containing hardmask is formed over the stack (step 108). A metal containing hardmask is formed over the carbon or silicon oxide containing hardmask (step 112). The carbon or silicon oxide containing hardmask and the metal containing hardmask are patterned (step 116). The stack is etched through the patterned hardmasks (step 120). Patterned hardmasks may include a combination of BARC/DARC/carbon or SiO2.

EXAMPLE

Figure 2A:
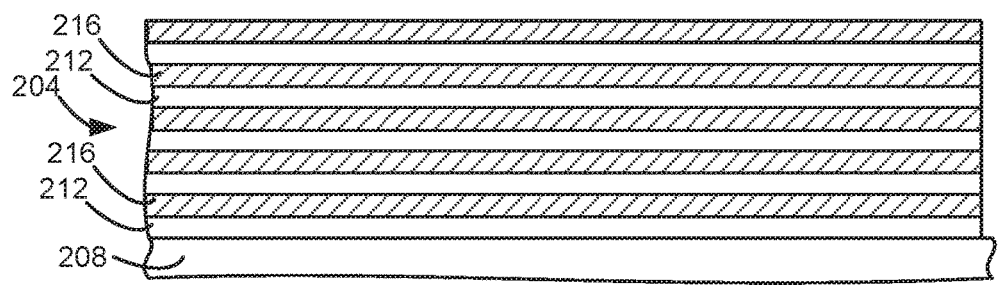
FIGS. 2A-G are schematic cross-sectional views of a memory stack formed according to an embodiment.

A stack is provided (step 104). In an example of an implementation of the disclosure, a 3D memory array is etched. In such a memory array, memory stacks are formed over a wafer. FIG. 2A is a cross sectional view of a plurality of layers of a stack 204 formed over a wafer 208. The stack 204 includes one or more layers disposed on top of the wafer 208. In this embodiment, the stack 204 is a plurality of memory stacks, which are formed by bilayers of a layer of silicon oxide ($SiO_2$) 216 on top of a layer of polysilicon 212.

Figure 2B:
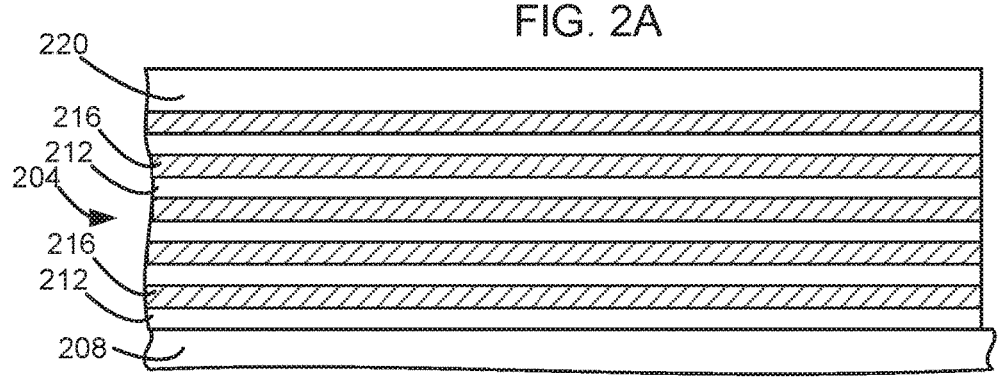

A carbon or silicon oxide hardmask is formed over the stack 204 (step 108). FIG. 2B is a cross sectional view of the stack 204 after a carbon or silicon oxide containing hardmask 220 is formed over the stack 204. In this embodiment, the carbon or silicon oxide containing hardmask 220 is amorphous carbon.

Figure 2C:
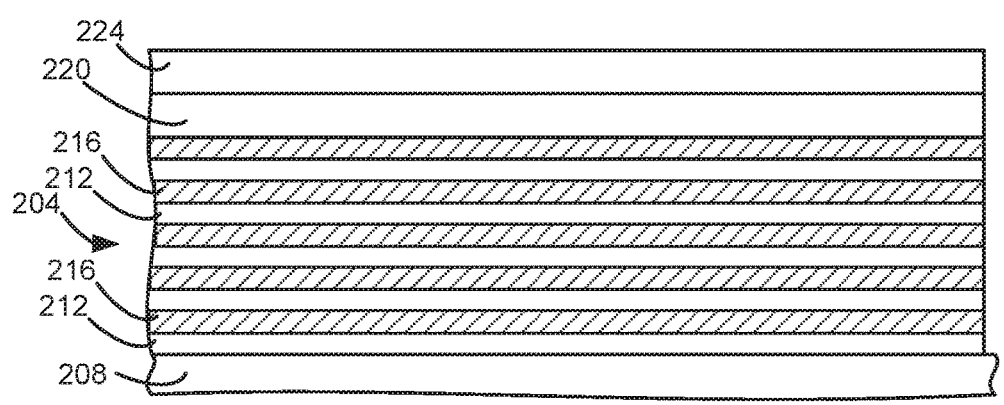

A metal containing hardmask is formed over the carbon or silicon oxide containing hardmask (step 112). FIG. 2C is a cross sectional view of the stack 204 after a metal containing hardmask 224 is formed over the carbon or silicon oxide containing hardmask 220. In this example, the metal containing hardmask 224 is titanium nitride (TiN).

Figure 2D:
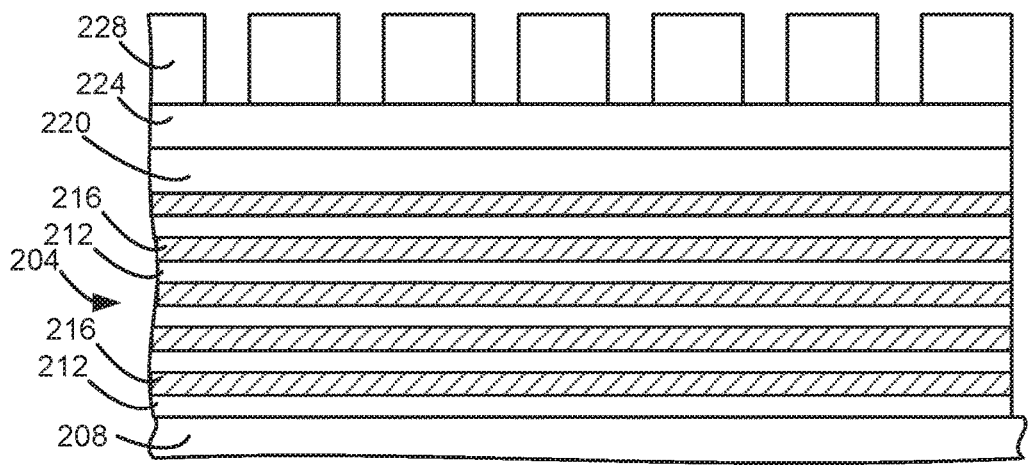
Figure 3:
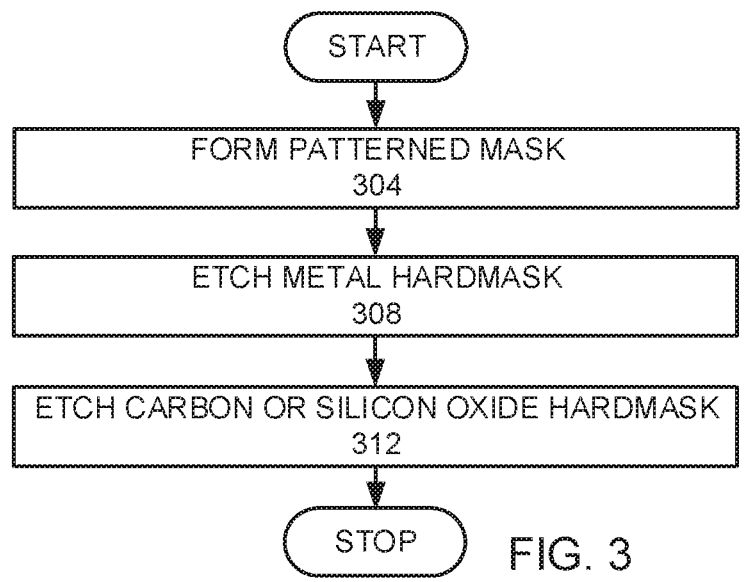
FIG. 3 is a more detailed flow chart of a process of patterning the hardmasks that may be used in an embodiment.

The hardmasks are patterned (step 116). FIG. 3 is a flow chart of a process for patterning the hardmask used in this embodiment. A patterned mask is formed over the metal containing hardmask (step 304). FIG. 2D is a cross sectional view of the stack 204 after a patterned mask 228 has been formed over the metal containing hardmask 224. In this example, the patterned mask 228 is formed from silicon nitride (SiN).

Figure 4:
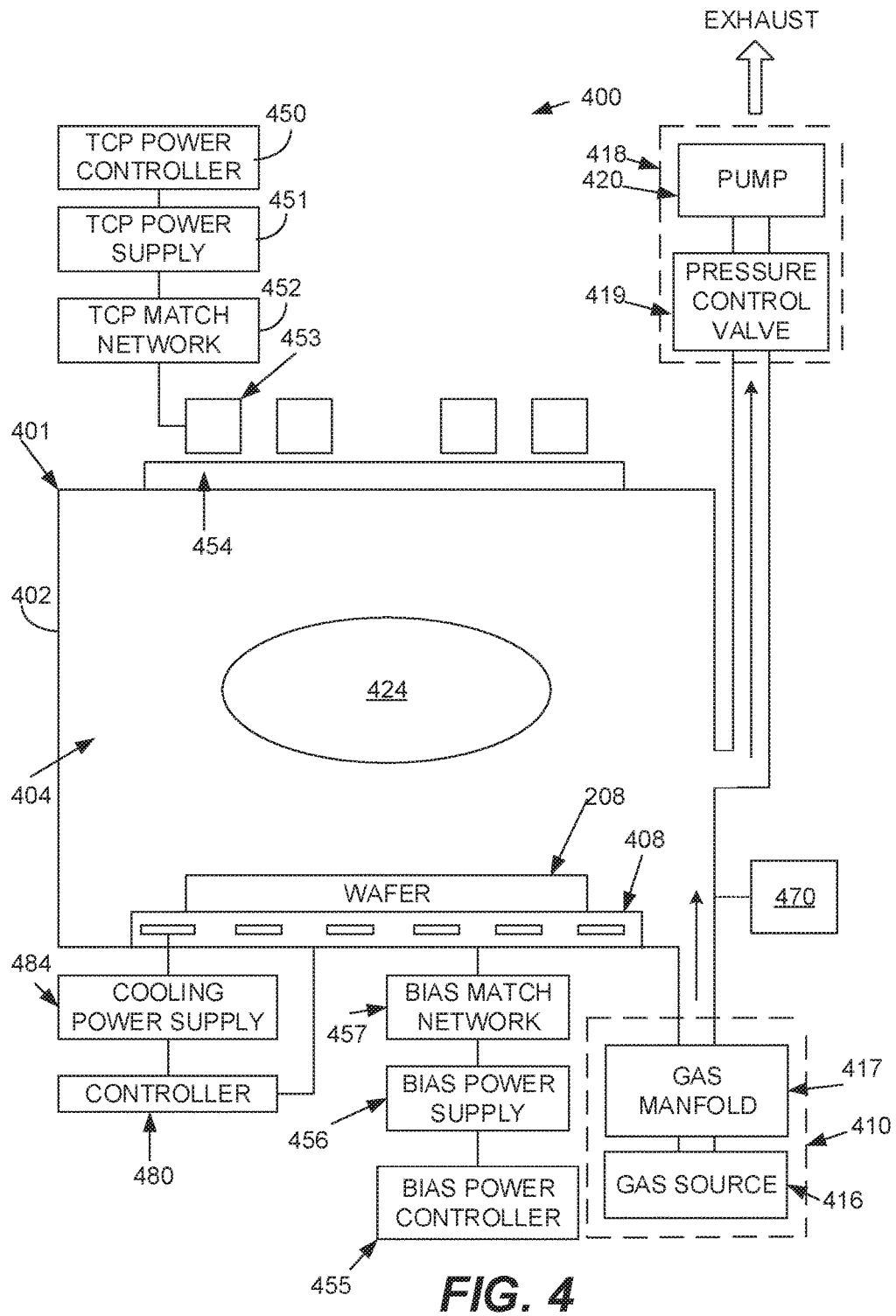
FIG. 4 is a schematic view of a processing chamber that may be used in practicing the disclosure.

The stack 204 may be placed in a processing tool to perform subsequent steps. FIG. 4 is a schematic view of a plasma processing system 400, including a plasma processing tool 401. The plasma processing tool 401 is an inductively coupled plasma etching tool and includes a plasma reactor 402 having a plasma processing chamber 404 therein. A transformer coupled power (TCP) controller 450 and a bias power controller 455, respectively, control a TCP supply 451 and a bias power supply 456 influencing the plasma 424 created within plasma processing chamber 404.

The TCP controller 450 sets a set point for TCP supply 451 configured to supply a radio frequency signal at 13.56 MHz, tuned by a TCP match network 452, to a TCP coil 453 located near the plasma processing chamber 404. An RF transparent window 454 is provided to separate TCP coil 453 from plasma processing chamber 404, while allowing energy to pass from TCP coil 453 to plasma processing chamber 404.

The bias power controller 455 sets a set point for bias power supply 456 configured to supply an RF signal, tuned by bias match network 457, to a chuck electrode 408 located within the plasma processing chamber 404 creating a direct current (DC) bias above electrode 408 which is adapted to receive the wafer 208, being processed.

A gas supply mechanism or gas source 410 includes a source or sources of gas or gases 416 attached via a gas manifold 417 to supply the proper chemistry required for the process to the interior of the plasma processing chamber 404. A gas exhaust mechanism 418 includes a pressure control valve 419 and exhaust pump 420 and removes particles from within the plasma processing chamber 404 and maintains a particular pressure within plasma processing chamber 404.

A temperature controller 480 controls the temperature of a cooling recirculation system provided within the chuck electrode 408 by controlling a cooling power supply 484. The plasma processing system also includes electronic control circuitry 470. The plasma processing system 400 may also have an end point detector. An example of such an inductively coupled system is the Kiyo built by Lam Research Corporation of Fremont, Calif., which is used to etch silicon, polysilicon and conductive layers, in addition to dielectric and organic materials. In other embodiments, a capacitively coupled system may be used.

Figure 5:
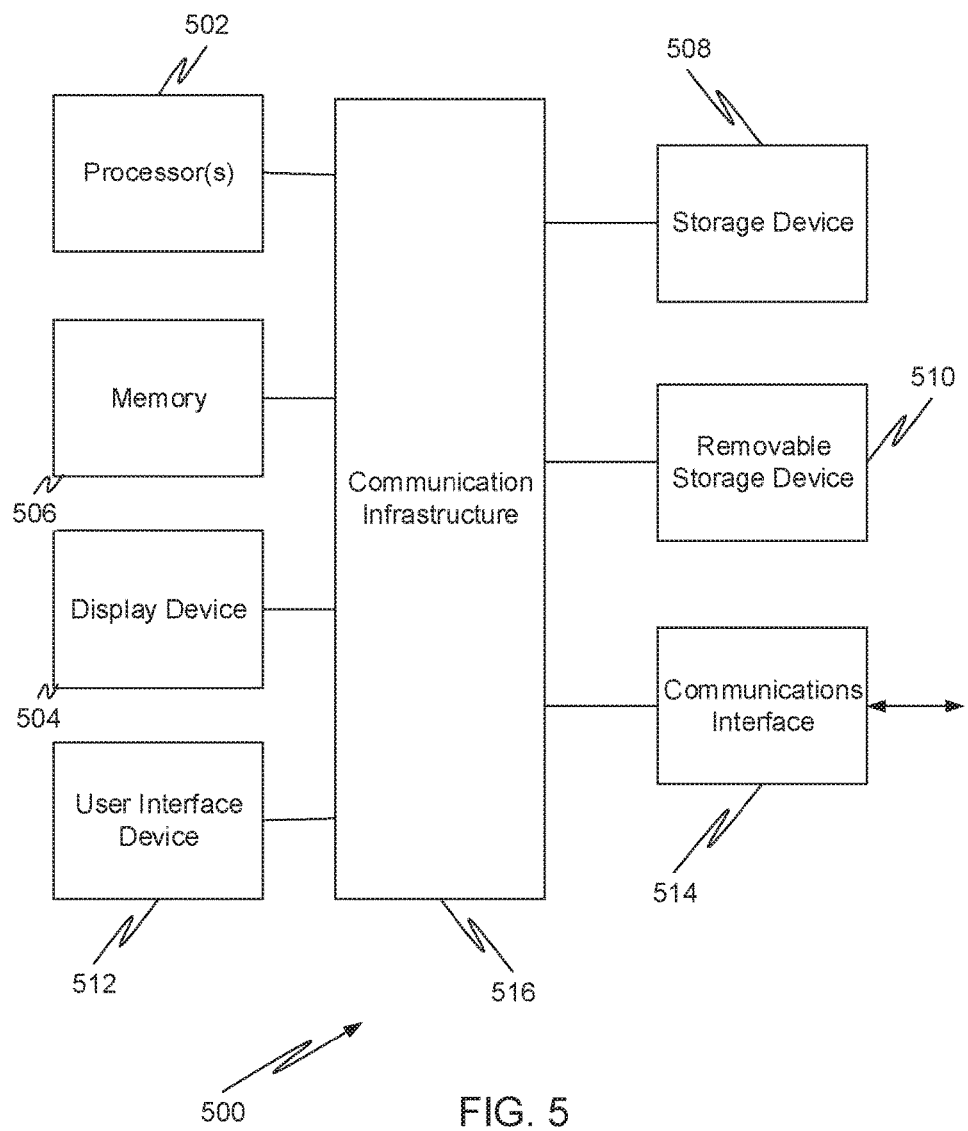
FIG. 5 illustrates a computer system, which is suitable for implementing a controller used in embodiments.

FIG. 5 is a high level block diagram showing a computer system 500, which is suitable for implementing a controller used in embodiments of the present disclosure. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present disclosure may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2E:
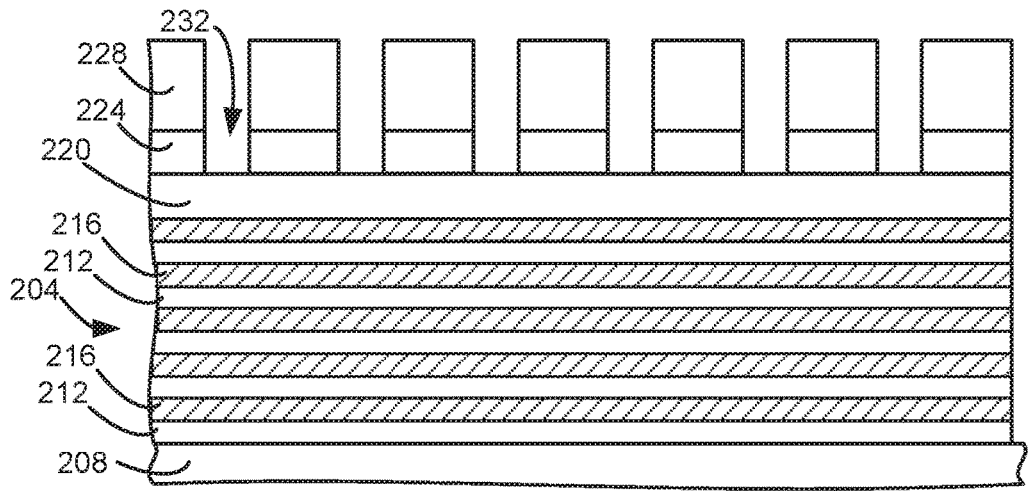
Figure 6:
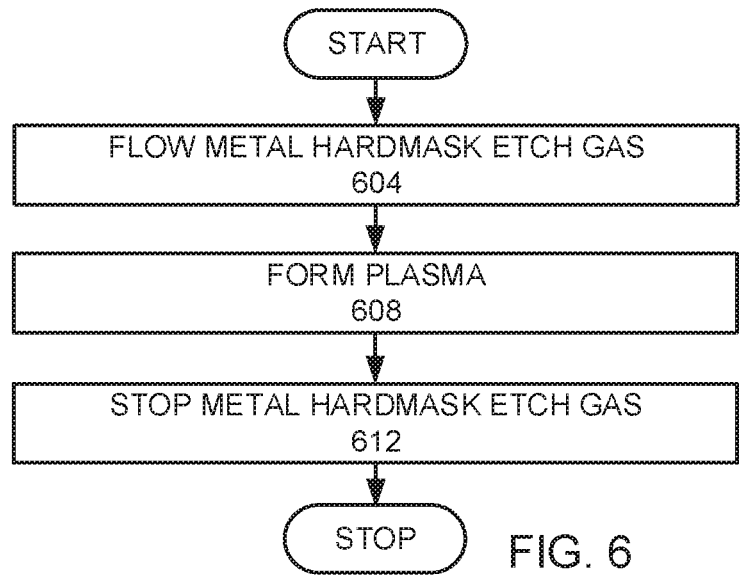
FIG. 6 is a more detailed flow chart of a process of etching the metal hardmask that may be used in an embodiment.

Within the plasma processing system 400, the metal containing hardmask 224 is etched (step 308). FIG. 6 is a more detailed flow chart of a process for etching the metal containing hardmask 224. A metal hardmask etch gas is flowed into the plasma processing chamber 404 (step 604). In this example, the metal hardmask etch gas is a combination of F and Cl containing halogen gases mixed with O2, Ar, N2 and He. Halogen gases could be $SF_6$, $NF_3$, $Cl_2$, $CH_2F_2$, or $C_4F_6$. The metal hardmask etch gas is formed into a plasma (step 608). In this example, a pressure in the range of 5-50 mT is provided. Source power from 500-2000 W is provided to form the etch gas into a plasma. A bias voltage of 100-1000 V is provided. The flow of the metal hardmask etch gas is stopped (step 612). FIG. 2E is a cross sectional view of the stack 204 after features 232 have been etched into the metal containing hardmask 224.

Figure 2F:
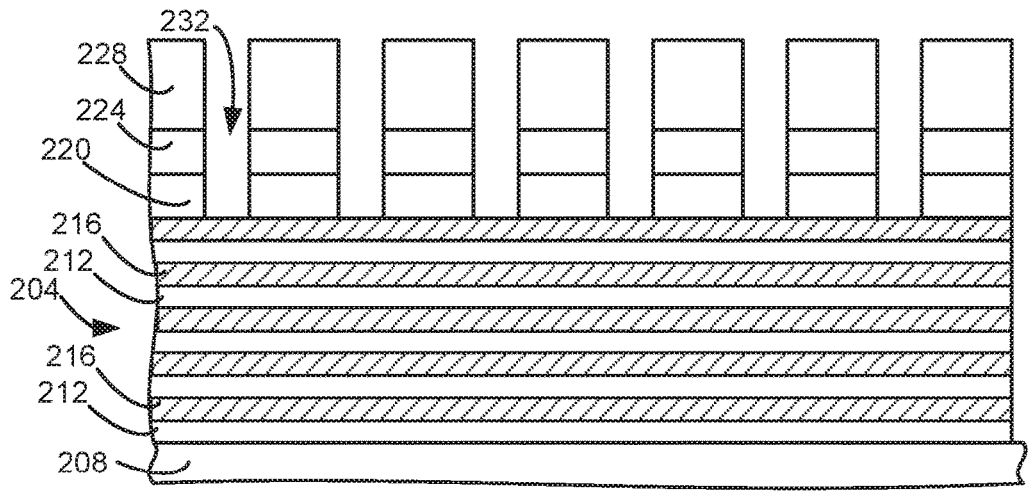
Figure 7:
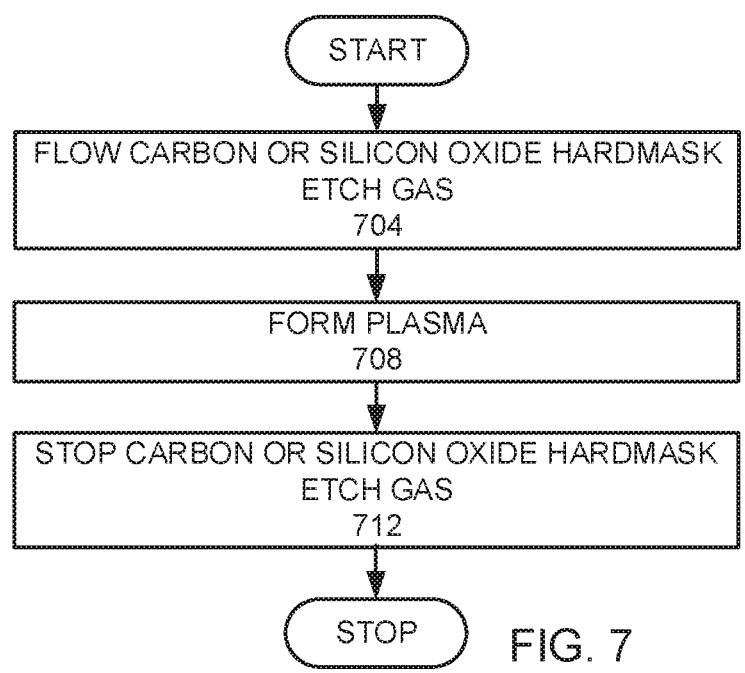
FIG. 7 is a more detailed flow chart of a process of etching the carbon or silicon oxide hardmask that may be used in an embodiment.

The carbon or silicon oxide containing hardmask 220 is etched (step 312). FIG. 7 is a more detailed flow chart of a process for etching the carbon or silicon oxide containing hardmask 220. A carbon or silicon oxide containing hardmask etch gas is flowed into the plasma processing chamber 404 (step 704). In this example, the carbon or silicon oxide containing hardmask etch gas is $CF_4$, $CH_2F_2$, $C_4F_6$, $NF_3$, $SF_6$, Ar, He, and $O_2$. The carbon or silicon oxide containing hardmask etch gas is formed into a plasma (step 708). In this example, a pressure in the range of 5-50 mT is provided. Source power from 500-2000 W is provided. A bias voltage 100-1000 V is provided. The flow of the carbon or silicon oxide containing hardmask etch gas is stopped (step 712). FIG. 2F is a cross sectional view of the stack 204 after features 232 have been etched into the carbon or silicon oxide containing hardmask 220.

Figure 2G:
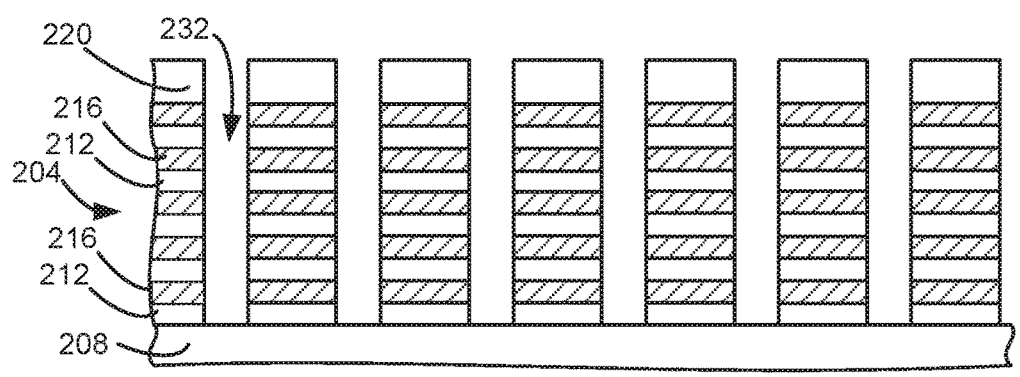

The stack 204 is etched through the patterned hardmasks (step 120). An example of a recipe for etching the stack 204 is an etch gas comprising a hydrofluorocarbon ($C_xH_yF_z$), HBr, He, and Ar, if the stack is OPOP, where x, y, and z are whole numbers. If the stack is ONON, then the etch gas comprises $C_xH_yF_z$, Ar, and He. FIG. 2G is a cross sectional view of the stack 204 after features 232 have been etched into the stack 204. In this embodiment, during the etching of the stack 204 (step 120), the metal containing hardmask 224 is consumed and the carbon or silicon oxide containing hardmask 220 acts as the mask during the remainder of the etching of the stack 204.

Other processes are used to further form the devices. Such processes may include a wet etch that cleans redeposited metal residue. In addition, if the carbon or silicon oxide containing hardmask 220 is carbon, then an ashing step may be used to remove the carbon or silicon oxide containing hardmask 220. Such an ashing process would be less damaging to the stack 204 than a process required to remove the metal containing hardmask 224, if the metal containing hardmask 224 were not removed during the etch.

This embodiment increases both the vertical and radial selectivity of the overall mask. The selectivity may be increased by 3 to 4 times. Radial selectivity is a function of faceting of the mask. As the faceting of the mask increases, the width or radial dimension of the etched feature increases. Therefore, to increase radial selectivity, mask faceting should be reduced. In this embodiment, the metal containing hardmask 224 provides the improved selectivity with respect to etching the stack 204. The carbon or silicon oxide containing hardmask 220 acts as a primary buffer during the etching of the stack 204 by absorbing the sputtered redeposition of the metal containing hardmask 224 during the etching of the stack 204. The sputtering is mainly from horizontal surfaces of the metal containing hardmask 224. Because the carbon or silicon oxide containing hardmask 220 absorbs redeposited sputtered metal from the metal containing hardmask 224, the resistance to etching of the carbon or silicon oxide containing hardmask 220 increases because the sidewalls of the carbon or silicon oxide containing hardmask 220 are impregnated with metal, which further improves selectivity. In addition, since the carbon or silicon oxide containing hardmask 220 absorbs redeposited sputtered metal, the carbon or silicon oxide containing hardmask 220 reduces or eliminates sputtered metal from reaching sidewalls of the stack 204, which reduces or eliminates sputtered metal contamination of the stack 204.

In other embodiments, the stack 204 may be a plurality of alternating layers of, alternating stacks of silicon oxide and silicon nitride (ONON), alternating stacks of silicon oxide and polysilicon (OPOP), or a single material such as silicon oxide. The stacks 204 may be used for different uses, such as 3D memory, a 3D NAND, or a DRAM capacitor. The carbon or silicon oxide containing hardmask 220 may have a metal dopant. In some embodiments, in the creation of high aspect ratio features, the stacks 204 may have more than 70 alternating layers. More preferably, the stacks 204 have more than 100 alternating layers. In other embodiments, the metal containing hardmask is made of TiOx, W (such as WOx, WN, or WC), or Ta (such as TaN or TaOx).

For etching the metal containing hardmask 224 generally a fluorine or halogen based etch gas is used to provide a chemical etch. Such an etch may alternate an etch phase with a passivation phase. For etching a carbon hardmask 220, an oxygen based chemical etch is used. In addition to oxygen, COS or $SO_2$ are added to the etch gas as a passivant. The etching of the stack 204 may also be a chemical etch, such as a halogen etch, with a high energy or bias plasma to etch high aspect ratio features. Preferably, such etches are not bombardment type etches. The metal containing hardmask 224 may be elemental metal, an alloy, a metal oxide, metal nitride, or metal carbide. For etching a stack 204 with silicon oxide, preferably the carbon or silicon oxide containing stack hardmask 220 is made of carbon. If the stack 204 does not contain silicon oxide, then the carbon or silicon oxide hardmask 220 may be silicon oxide. Preferably, the patterned mask 228 is used to etch both the metal containing hardmask 224 and the carbon or silicon oxide containing hardmask 220. However, in other embodiments, the patterned mask 228 may be used to etch the metal containing hardmask 224, and the metal containing hardmask 224 may be used to etch the carbon or silicon oxide containing mask 220. Such an embodiment might degrade the metal containing hardmask 224 while opening the carbon or silicon oxide containing hardmask 220.

Figure 8A:
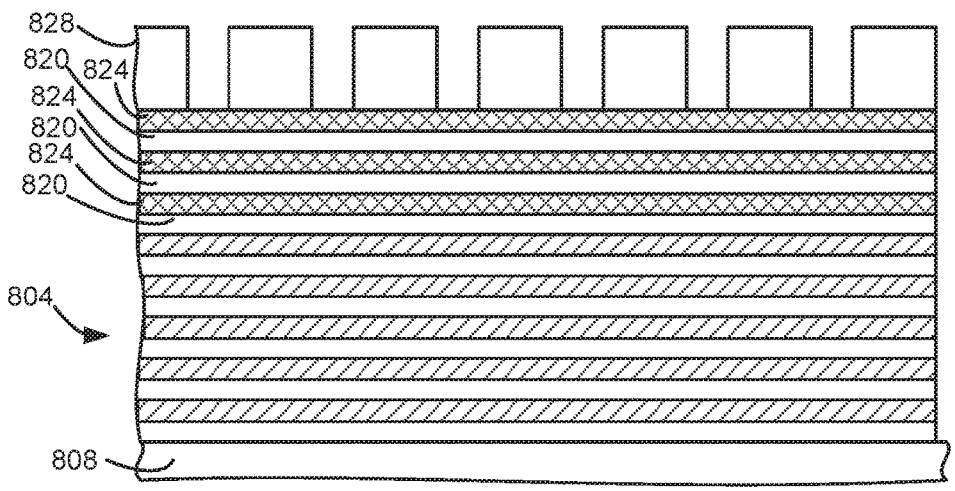
FIGS. 8A-C are schematic cross-sectional views of a memory stack formed according to another embodiment.

In another embodiment, the steps of forming a carbon or silicon oxide hardmask (step 108) and forming a metal hardmask (step 112) are cyclically repeated a plurality of times to form a plurality of alternating layers of carbon or silicon oxide hardmasks and metal hardmasks. FIG. 8A is a cross sectional view of the stack 804 after a plurality of alternating carbon or silicon oxide containing hardmasks 820 and metal containing hardmasks 824 have been formed.

Figure 8B:
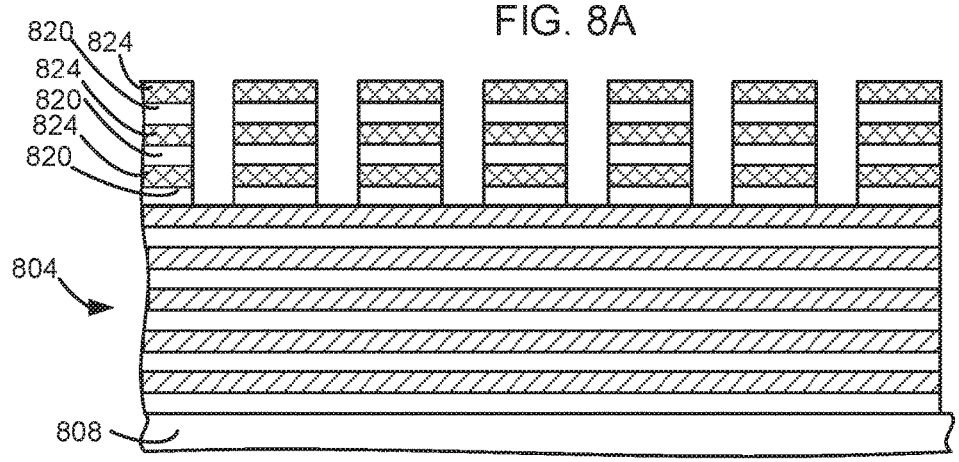

To pattern the hardmasks (step 116), as in the previous embodiment, a patterned mask 828 may be formed (step 304). The steps of etching the metal containing hardmask 824 (step 308) and etching the carbon or silicon oxide containing hardmask 820 (step 312) are cyclically repeated a plurality of times. FIG. 8B is a cross sectional view of the stack 804 after the plurality of alternating carbon or silicon oxide containing hardmasks 820 and metal containing hardmask 824 have been etched using a plurality of cycles of alternating etching the metal containing hardmask 824 (step 308) and etching the carbon or silicon oxide containing hardmask 820 (step 312). In this example, the patterned mask 828 is removed during the etching of the patterning the hardmasks.

Figure 8C:
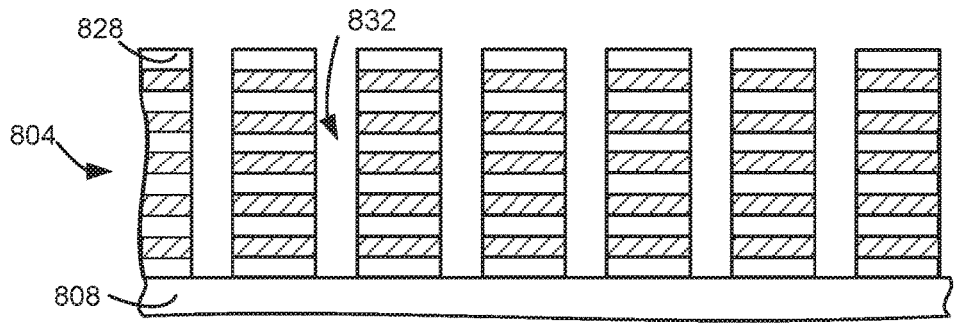

The stack 804 is etched through the hardmasks (step 120). The process used in the previous embodiment may be used to etch the stack 804 or other processes may be used. FIG. 8C is a cross sectional view of the stack 804 after features 832 have been etched into the stack 804.

FIG. 9 is a high level flow chart of a process that may be used in another embodiment. An oxide-metal-oxide-metal (OMOM) stack is provided (step 904). A first mask layer of carbon or silicon oxide is formed over the stack (step 908). A second mask layer of a metal containing material is formed over the first mask layer (step 912). A third mask layer of carbon or silicon oxide is formed over the second mask layer (step 916). A fourth mask layer of a metal containing material is formed over the third mask layer (step 920). The mask layers are patterned (step 924). The stack is etched through the patterned masks (step 928).

Figure 10A:
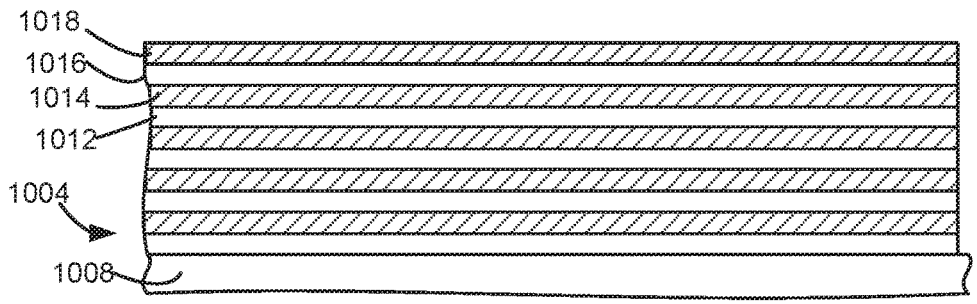
FIGS. 10A-J are schematic cross-sectional views of a stack processed according to an embodiment.

In an example, an OMOM stack is provided (step 904). FIG. 10A is a cross sectional view of a plurality of layers of a stack 1004 formed over a wafer 1008. The stack 1004 includes one or more layers disposed on top of the wafer 1008. In this embodiment, the stack 1004 is a ReRAM stack, which is formed by bilayers of a layer of a metal containing material on top of a layer of silicon oxide ($SiO_2$). In this example, the metal containing material layers are W or TiN. In this example, there are a plurality of bilayers between the wafer 1008 and a first layer 1012 of carbon or silicon oxide. A second layer 1014 of a metal containing material is over the first layer 1012. Third layer 1016 of carbon or silicon oxide is over the second layer 1014. A fourth layer 1018 of a metal containing material is over the third layer 1016. Additional bilayers may be over the fourth layer 1018. The stack 1004 is placed in a Chemical Vapor Deposition (CVD) chamber.

In this example, first mask layer of carbon or silicon oxide layer is formed over the stack (step 908). In this example, a carbon buffer layer is formed over the stack 1004. A first mask layer of silicon oxide is formed over the carbon buffer layer. A second mask layer of a metal containing material is formed over the first mask layer (step 912). In this example, the second mask layer is made of the same metal containing material as the metal containing material layers of the stack 1004. A third mask layer of silicon oxide is formed over the second mask layer (step 916). A fourth mask layer of a metal containing material is formed over the third mask layer (step 920). In this example, the fourth mask layer is made of the same metal containing material as the metal containing layers of the stack 1004. Additional mask layers may be added in various embodiments. The additional mask layers may be alternating silicon oxide and metal containing layers. Preferably, the first, second, third, and fourth mask layers are formed by chemical vapor deposition in the CVD chamber.

Figure 10B:
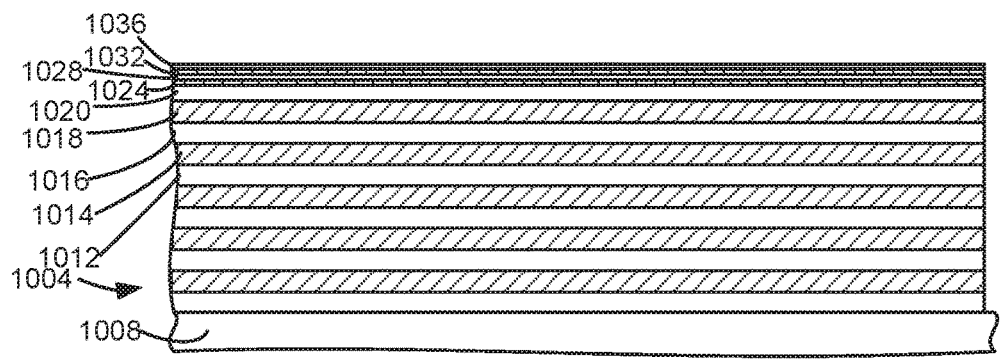

FIG. 10B is a cross sectional view of the stack 1004 after the carbon buffer layer 1020, the first mask layer 1024, the second mask layer 1028, the third mask layer 1032, and the fourth mask layer 1036 have been formed over the stack 1004. In this example, the first mask layer 1024, the second mask layer 1028, the third mask layer 1032, and the fourth mask layer 1036 are relatively thin compared to the first, second, third, or fourth layers 1012, 1014, 1016, and 1018. Preferably, each of the first mask layer 1024, the second mask layer 1028, the third mask layer 1032, and the fourth mask layer 1036 have a thickness which is less than half of the thickness of the first, second, third, or fourth layers 1012, 1014, 1016, 1018. The ratio of the film thicknesses between the film in the stack and the film in the mask in these examples would be between 2:1 and 20:1, in most cases 4:1.

Figure 10C:
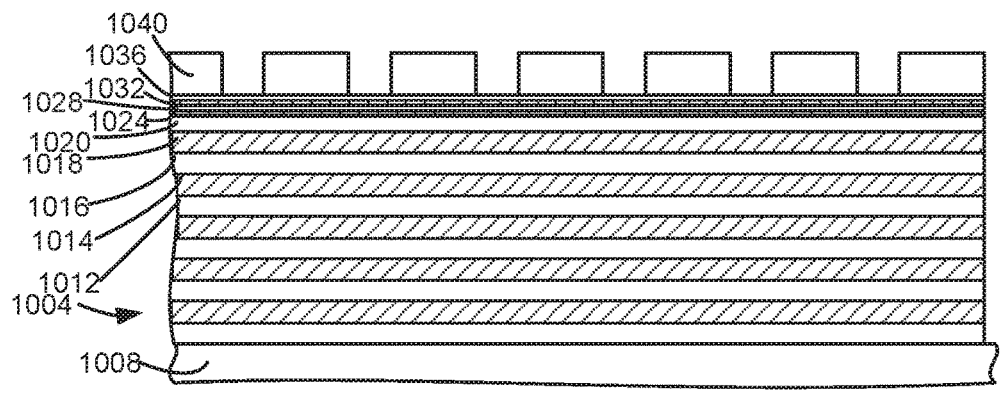
Figure 10D:
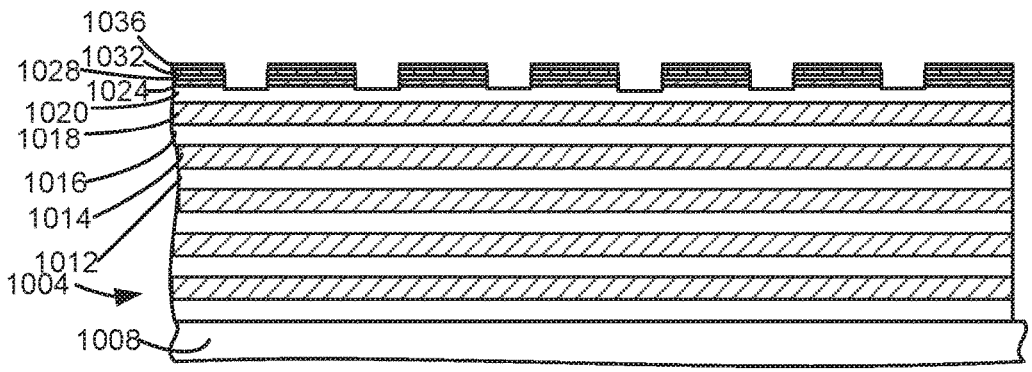
Figure 10E:
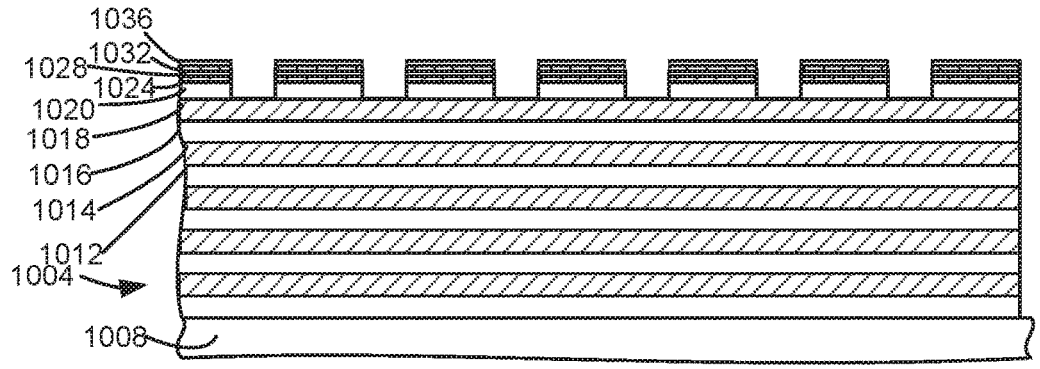

The mask layers are patterned (step 924). In this example, a patterned photoresist mask is formed over the mask layers. FIG. 10C is a cross-sectional view of the stack 1004 after a photoresist mask 1040 has been formed over the fourth mask layer 1036. In various embodiments, other layers, such as an antireflective coating, may be placed between the fourth mask layer 1036 and the photoresist mask 1040. The pattern is then transferred from the photoresist mask 1040 to the first mask layer 1024, the second mask layer 1028, the third mask layer 1032, and the fourth mask layer 1036. In this example, a single etch process is able to etch the first mask layer 1024, the second mask layer 1028, the third mask layer 1032, and the fourth mask layer 1036. Since the mask layers are relatively thin, a single non-selective etch process is able to etch all of the mask layers, instead of requiring separate etch recipes for reach mask layer. An example of a recipe for etching the mask layers provide a mask etch gas comprising a halogen component. The mask etch gas is formed into a plasma, which is used to etch the first, second, third, and fourth mask layers 1024, 1028, 1032, 1036. The flow of the mask etch gas is stopped. The buffer layer 1020 acts as an etch stop. FIG. 10D is a cross-sectional view of the stack 1004 after the pattern has been transferred from the photoresist mask to the mask layers. In this example, the pattern transfer removes the photoresist mask. The process slightly etches buffer layer 1020, creating recesses. In other embodiments, the photoresist mask may be removed after the pattern transfer. The carbon buffer layer 1020 acts as an etch stop to prevent the non-selective pattern transfer to the masks from etching the underlying fourth layer of a metal containing material layer 1018. In this example, a selective etch is used to open the buffer layer 1020. FIG. 10E is a cross-sectional view of the stack 1004 after the buffer layer 1020 has been opened.

Figure 10F:
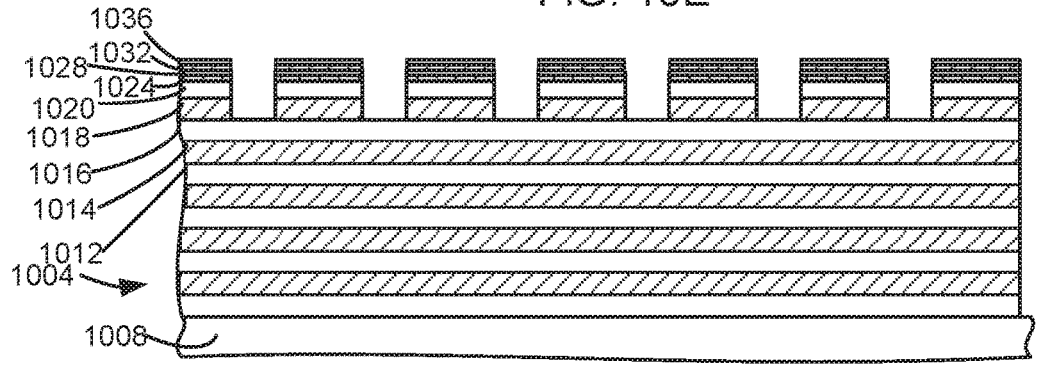

The stack is etched through the masks (step 928). In this example, two highly selective etch recipes are used. A first etch recipe highly selectively etches the metal containing material with respect to silicon oxide. The second etch recipe highly selectively etches silicon oxide with respect to the metal containing material. The high selectivity is at least 2:1. The fourth mask layer 1036 of silicon oxide is used as a mask to highly selectively etch the fourth layer 1018 of a metal containing material. Because the etch is highly selective, in this example, only a small amount of the fourth etch mask layer 1036 is etched. For an etch process where the metal containing material is TiN the etch process would use a $Cl_2/CH_4/Ar$ based process chemistry. If the metal containing material is W, the process could be $Cl_2/SF_6/Ar$ based. The process gas would be formed into a plasma in order to etch a layer. FIG. 10F is a cross-sectional view of the stack after the fourth layer 1018 is etched.

Figure 10G:
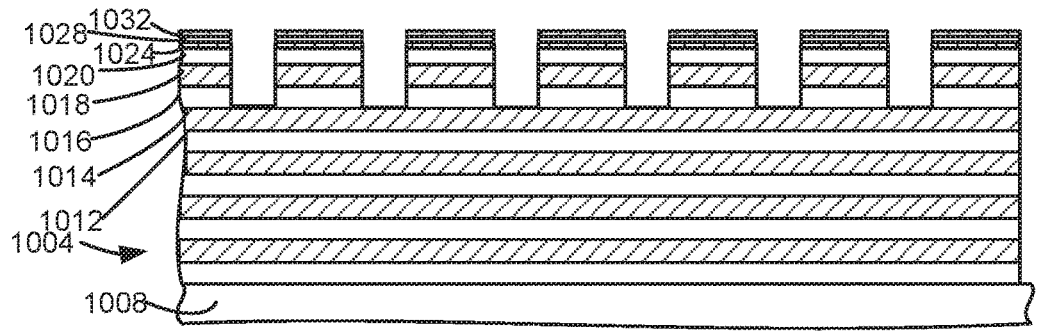

The third mask layer 1032 of a metal containing material is used as a mask to highly selectively etch the third layer 1016 of silicon oxide. Because the etch is highly selective, in this example, only a small amount of the third etch mask layer 1032 is etched. However, since the recipe selectively etches silicon oxide and since in this example, the fourth mask is silicon oxide, the fourth mask is also etched away. The etch process for layer 1016 could deploy a fluorocarbon $(C_xF_y)/Ar/O_2$ based process chemistry, which is transformed into a plasma. Such a process would remove the remaining material of mask layer 1036 very fast. FIG. 10G is a cross-sectional view of the stack after the third layer 1016 is etched. The fourth mask layer has been etched away in this example.

Figure 10H:
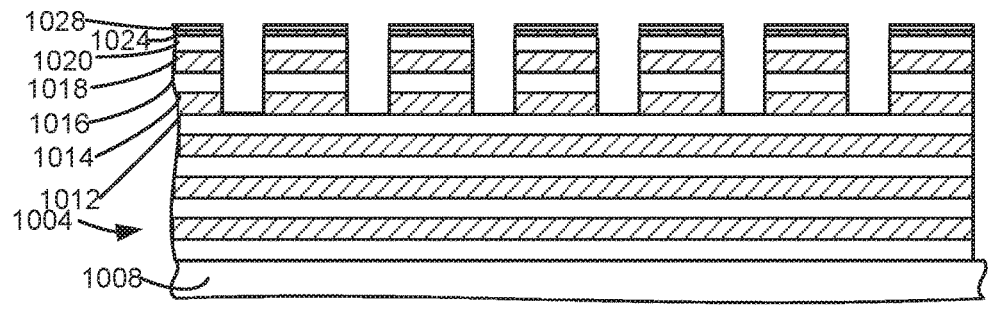

The second mask layer 1028 of silicon oxide is used as a mask to highly selectively etch the second layer of a metal containing material 1014. Because the etch is highly selective, in this example, only a small amount of the second etch mask layer 1028 is etched. The same recipe may be used as the recipe for etching the fourth layer 1018. FIG. 10H is a cross-sectional view of the stack after the second layer 1014 is etched. Because the third mask layer is the same metal containing material as the second layer 1014, the third mask layer is removed by the etch.

Figure 10I:
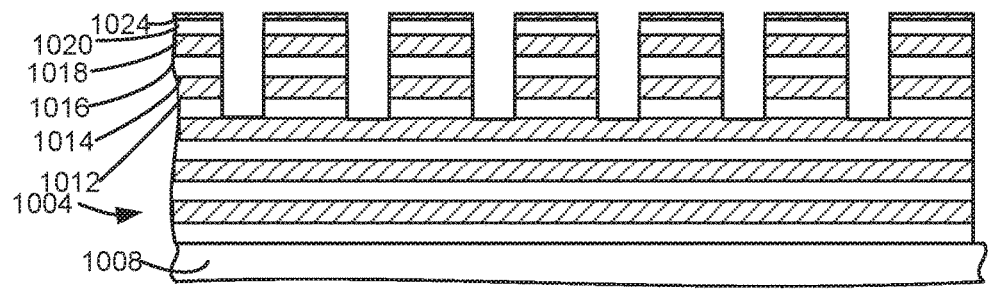

The first mask layer 1024 of a metal containing material is used as a mask to highly selectively etch the first layer 1012 of silicon oxide. Because the etch is highly selective, in this example, only a small amount of the first etch mask layer 1024 is etched. However, since the recipe selectively etches silicon oxide and since in this example, the second mask is silicon oxide, the second mask is also etched away. The same recipe may be used as the recipe for etching the third layer 1016. FIG. 10I is a cross-sectional view of the stack after the first layer 1012 is etched. The second mask layer has been etched away in this example.

Figure 10J:
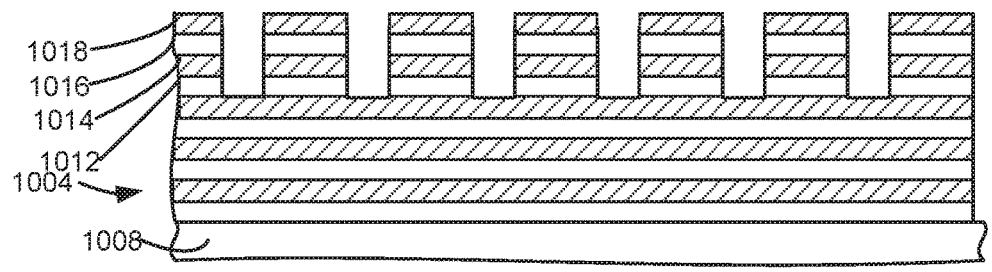

Additional steps may be performed. For example, the first etch mask layer 1024 may be removed. Sputtering may be used to remove the first etch mask 1024. The buffer layer 1020 may be used to absorb metal that is sputtered the first etch mask 1024, protecting the layers below the buffer layer 1020. The buffer layer 1020 may then be removed or it could serve and a stop layer for subsequent etch and CMP processes. FIG. 10J is a cross-sectional view of the stack after the first mask layer and buffer are removed. In this embodiment, the hardmask is used to etch at least four layers of the stack.

Since the same metal containing material is used in the mask layers and the stack layers that are etched and some of the mask layers and stack layers to be etched are silicon oxide, the etching of a stack layer is used to remove a previous mask layer. Because of the high selectivity between the mask and etch layer, the mask layers may be much thinner than the etch layers. Because the mask layers are sufficiently thin, all of the mask layers may be etched by a single etch process. Preferably, the selectivity of etching the layers with respect to the mask layers is at least 4:1.

In other embodiments, if additional layers are etched, additional mask layers are formed between the buffer layer 1020 and the first mask layer 1024, so that all of the bilayers are etched. In other embodiments, the metal containing material layers may be formed from metal, a metal alloy, a metal oxide or metal nitride. Preferably, the metal containing material has a low resistivity. Preferably, the electrical resistivity of the metal containing material is less than $10^{-5}$ Ohm*m. More preferably, the metal containing material is one or more of Ti, TiN, W, Sn, $SnO_x$, Ru, or Ta. In various embodiments, 10 to 20 layers are etched, using 10 to 20 mask layers. In other embodiments, the stack has more than 100 layers. Various embodiments are able to provide a CD of less than 20 nm, while avoiding structure collapse.

While this disclosure has been described in terms of several preferred embodiments, there are alterations, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method for etching features, comprising:
   forming a hardmask over an OMOM stack, the OMOM stack comprising a first layer of silicon oxide, a second layer of a metal containing material over the first layer, a third layer of silicon oxide over the second layer, and a fourth layer of a metal containing material over the third layer, wherein the forming a hardmask over the stack, comprises:
      forming a first mask layer comprising a metal containing material over the stack;
      forming a second mask layer comprising carbon or silicon oxide over the first mask layer;
      forming a third mask layer comprising a metal containing material over the second mask layer; and
      forming a fourth mask layer comprising carbon or silicon oxide over the third mask layer;
   patterning the hardmask; and
   etching the OMOM stack through the hardmask.

2. The method, as recited in claim 1, wherein the patterning the hardmask, comprises:
   flowing a hardmask etch gas comprising a halogen component; and
   forming the hardmask etch gas into a plasma, which etches the first mask layer, the second mask layer, the third mask layer, and the fourth mask layer, which forms the first mask layer into a first patterned mask, and forms the second mask layer into a second patterned mask, and forms the third mask layer into a third patterned mask, and forms the fourth mask layer into a fourth patterned mask; and
   stopping the flow of the hardmask etch gas.

3. The method, as recited in claim 2, wherein the etching the stack through the hardmask, comprises:
   etching the fourth layer using the fourth patterned mask;
   etching the third layer using the third patterned mask, wherein the etching the third layer removes the fourth patterned mask;
   etching the second layer using the second patterned mask, wherein the etching the second layer removes the third patterned mask; and
   etching the first layer using the first patterned mask, wherein the etching the first layer removes the second patterned mask.

4. The method, as recited in claim 3, wherein the second layer and the fourth layer each have a resistivity of less than $10^{-5}$ Ohm*m.

5. The method, as recited in claim 4, wherein the second layer and the fourth layer are a metal, a metal alloy, a metal oxide or metal nitride.

6. The method, as recited in claim 4, wherein the second layer and fourth layer are at least one of titanium, titanium nitride, tungsten, tin, tin oxide, ruthenium, tantalum.

7. The method, as recited in claim 5, wherein the third layer has a thickness and wherein the first, second, third, and fourth mask layers each have a thickness less than half the thickness of the third layer.

8. The method, as recited in claim 4, wherein the second mask layer and fourth mask layer are silicon oxide.

9. The method, as recited in claim 4, wherein the first mask layer and the third mask layer each have a resistivity of less than $10^{-5}$ Ohm*m.

10. The method, as recited in claim 4, wherein the third mask layer is of the same material as the second layer, so that the etching of the second layer removes the third mask layer.

11. The method, as recited in claim 10, wherein the first mask layer is of the same material as the third mask layer.

12. The method, as recited in claim 2, further comprising forming a carbon buffer layer over the stack before forming the first mask layer, and wherein the carbon buffer layer is used as an etch stop during patterning the hardmask.

13. The method, as recited in claim 1, wherein the forming the first mask layer forms the first mask layer by chemical vapor deposition, and wherein the forming the second mask layer forms the second mask layer by chemical vapor deposition, and wherein the forming the third mask layer forms the third mask layer by chemical vapor deposition and wherein the forming the fourth mask layer forms the fourth mask layer by chemical vapor deposition.

14. The method, as recited in claim 2, wherein the etching the stack through the hardmask, comprises:
   etching the fourth layer using the fourth patterned mask;
   etching the third layer using the third patterned mask, wherein the etching the third layer removes the fourth patterned mask;
   etching the second layer using the second patterned mask, wherein the etching the second layer removes the third patterned mask; and
   etching the first layer using the first patterned mask, wherein the etching the first layer removes the second patterned mask.

15. The method, as recited in claim 1, wherein the third layer has a thickness and wherein the first, second, third, and fourth mask layers each have a thickness less than half the thickness of the third layer.

16. The method, as recited in claim 1, wherein the second mask layer and fourth mask layer are silicon oxide.

17. The method, as recited in claim 1, wherein the third mask layer is of the same material as the second layer, so that the etching of the second layer removes the third mask layer.

18. The method, as recited in claim 17, wherein the first mask layer is of the same material as the third mask layer.

* * * * *